(12) United States Patent
Kim

(10) Patent No.: US 9,094,003 B2
(45) Date of Patent: Jul. 28, 2015

(54) BUFFERING CIRCUIT, SEMICONDUCTOR DEVICE HAVING THE SAME, AND METHODS THEREOF

(71) Applicant: Magnachip Semiconductor, Ltd., Cheongju-si (KR)

(72) Inventor: Jung-hyun Kim, Cheongju-si (KR)

(73) Assignee: Magnachip Semiconductor Ltd., Cheongju-si (KR)

( * ) Notice: Subject to any disclaimer, the term of this patent is extended or adjusted under 35 U.S.C. 154(b) by 78 days.

(21) Appl. No.: 13/932,633

(22) Filed: Jul. 1, 2013

(65) Prior Publication Data

US 2013/0285702 A1    Oct. 31, 2013

Related U.S. Application Data

(62) Division of application No. 13/081,989, filed on Apr. 7, 2011, now Pat. No. 8,502,562.

(30) Foreign Application Priority Data

Aug. 31, 2010  (KR) .................. 10-2010-0084641

(51) Int. Cl.
  *H03K 19/0175*    (2006.01)
  *H03K 3/356*      (2006.01)
  *H03K 19/0185*    (2006.01)

(52) U.S. Cl.
  CPC .. *H03K 19/017509* (2013.01); *H03K 3/356139* (2013.01); *H03K 19/018521* (2013.01)

(58) Field of Classification Search
  None
  See application file for complete search history.

(56) References Cited

U.S. PATENT DOCUMENTS

| 4,982,119 | A | 1/1991 | Tateishi |
| 6,037,801 | A | 3/2000 | Zhu |
| 6,819,616 | B2 | 11/2004 | La et al. |
| 6,870,776 | B2 | 3/2005 | Kim et al. |
| 7,262,651 | B2 | 8/2007 | Kwon |
| 7,307,448 | B2 | 12/2007 | Snider et al. |
| 2003/0076134 | A1 | 4/2003 | Chung |
| 2003/0179619 | A1 | 9/2003 | La et al. |
| 2004/0057322 | A1 | 3/2004 | Kim et al. |
| 2007/0234158 | A1* | 10/2007 | Shin .............................. 714/731 |
| 2010/0225796 | A1 | 9/2010 | Lim et al. |
| 2011/0291703 | A1 | 12/2011 | Lee et al. |

FOREIGN PATENT DOCUMENTS

KR    10-0646321 B1    11/2006

OTHER PUBLICATIONS

Office Action issued by the Korean Intellectual Property Office on Jul. 25, 2011, in counterpart Korean Application No. 10-2010-0084641 (4 pages, in Korean).

\* cited by examiner

*Primary Examiner* — Crystal L Hammond
(74) *Attorney, Agent, or Firm* — NSIP Law

(57) ABSTRACT

A multipoint low-voltage differential signaling (mLVDS) receiver of a semiconductor device and a buffering circuit of a semiconductor device, includes: an even-number data buffering unit configured to: sample even-number data from input data, amplify and output the even-number data in a section in which a positive clock is activated, and latch the even-number data in a section in which the positive clock is inactivated, and an odd-number data buffering unit configured to: sample odd-number data from the input data, amplify and output the odd-number data in a section in which a negative clock is activated, and latch the odd-number data in a section in which the negative clock is inactivated.

9 Claims, 8 Drawing Sheets

BUFFERING CIRCUIT, SEMICONDUCTOR DEVICE HAVING THE SAME, AND METHODS THEREOF

CROSS-REFERENCE TO RELATED APPLICATION(S)

This application is a Divisional Application of U.S. application Ser. No. 13/081,989, filed Apr. 7, 2011, which claims the benefit under 35 U.S.C. §119(a) of Korean Patent Application No. 10-2010-0084641, filed in the Korean Intellectual Property Office on Aug. 31, 2010, the entire disclosures of which are incorporated herein by reference for all purposes.

BACKGROUND

1. Field

The following description relates to a semiconductor design technology, and more particularly, to a mini low voltage differential signal (mLVDS) of a semiconductor device.

2. Description of Related Art

A display driver IC (DDI) is used to drive a liquid crystal display (LCD) in an apparatus such as a notebook monitor or a television, and a multipoint low-voltage differential signaling (mLVDS)receiver is used as an interface of the DDI.

FIG. 1 is a block diagram to explain the operation of a conventional mLVDS receiver.

Referring to FIG. 1, the conventional mLVDS receiver includes an input buffering unit 100 for determining a logic level through the process of receiving and buffering an mLVDS (DATA_PLUS, DATA_MINUS), amplifying and outputting (DATA_AMP) a voltage level, a first serial/parallel conversion unit 120 for receiving an output signal (DATA_AMP) of the input buffering unit 100, performing serial/parallel conversion on the received output signal to even-number data (EVEN_DATA) and odd-number data (ODD_DATA) with reference to a clock signal (CLK_OUT, CLK_OUTB), and outputting the converted signal, and a second serial/parallel conversion unit 140 for receiving the even-number data (EVEN_DATA) and odd-number data (ODD_DATA) output from the first serial/parallel unit conversion unit 120, performing serial/parallel conversion on the received even-number data (EVEN_DATA) and odd-number data (ODD_DATA) to a plurality of parallel data (DATA_OUT<0>, DATA_OUT<1>, DATA_OUT<2>, DATA_OUT<3>, DATA_OUT<4>, DATA_OUT<5>) with reference to the clock signal (CLK_OUT, DIVIDED CLK_OUT), and outputting the converted data.

As described above, the conventional mLVDS receiver converts a signal (DATA_AMP) into even-number data (EVEN_DATA) and odd-number data (ODD_DATA) through a first serial/parallel conversion by transmitting the signal (DATA_AMP) amplified through the input buffering unit 100 to the first serial/parallel conversion unit 120, and converts even-number data (EVEN_DATA) and odd-number data (ODD_DATA) into a plurality of parallel data (DATA_OUT<0>, DATA_OUT<1>, DATA_OUT<2>, DATA_OUT<3>, DATA_OUT<4>, DATA_OUT<5>) through a second serial/parallel conversion by transmitting the even-number data (EVEN_DATA) and the odd-number data (ODD_DATA) to the second serial/parallel conversion unit 140.

In order to generate a plurality of parallel data (DATA_OUT<0>, DATA_OUT<1>, DATA_OUT<2>, DATA_OUT<3>, DATA_OUT<4>, DATA_OUT<5>) through the above two serial/parallel conversion operations, two components, that is, the first serial/parallel conversion unit 120 and the second serial/parallel conversion unit 140 are required.

The operation of the conventional mLVDS receiver is very inefficient and causes various problems such as increasing power consumption, increasing a layout space and complicating a signal path.

SUMMARY

In one general aspect, there is provided a buffering circuit of a semiconductor device, the buffering circuit including: an even-number data buffering unit configured to: sample even-number data from input data, amplify and output the even-number data in a section in which a positive clock is activated, and latch the even-number data in a section in which the positive clock is inactivated, and an odd-number data buffering unit configured to: sample odd-number data from the input data, amplify and output the odd-number data in a section in which a negative clock is activated, and latch the odd-number data in a section in which the negative clock is inactivated.

The buffering circuit may further include a rail-to-rail signal input unit configured to receive the input data without reducing a voltage level swing scope.

In the buffering circuit, the even-number data buffering unit may include: an even-number data sampling unit configured to control providing the input data from the rail-to-rail signal input unit to an even-number data input end, in response to the positive clock, an even-number data amplification unit configured to: generate even-number amplification data by amplifying data provided to the even-number data input end in a section in which the positive clock is activated, and latch even-number amplification data in a section in which the positive clock is inactivated, and an even-number data output unit configured to determine a logic level of an even number corresponding to a voltage level of the even-number amplification data.

In the buffering circuit, the odd-number data buffering unit may include: an odd-number data sampling unit configured to control providing the input data from the rail-to-rail signal input unit to an odd-number data input end, in response to the negative clock, an odd-number data amplification unit configured to: generate odd-number amplification data by amplifying data provided to the odd-number data input end in a section in which the negative clock is activated, and latch odd-number amplification data in a section in which the negative clock is inactivated, and an odd-number data output unit configured to determine a logic level of an odd number corresponding to a voltage level of the odd-number amplification data.

In the buffering circuit, the even-number data sampling unit may be further configured to: provide the input data input from the rail-to-rail data input unit to the even-number data input end, in response to: a change of the positive clock from an inactivated state to an activated state, and a change of the negative clock from an activated state to an inactivated state, and not provide the input data input from the rail-to-rail data input unit to the even-number data input end, in response to: a change of the positive clock from an activated state to an inactivated state, and a change of the negative clock from an inactivated state to an activated state.

In the buffering circuit, the odd-number data sampling unit may be further configured to: provide the input data input from the rail-to-rail data input unit to the odd-number data input end, in response to: a change of the negative clock from an inactivated state to an activated state, and a change of the positive clock from an activated state to an inactivated state, and not provide the input data input from the rail-to-rail data input unit to the odd-number data input end, in response to: a change of the negative clock from an activated state to an inactivated state, and a change of the positive clock from an inactivated state to an activated state.

In the buffering circuit, the even-number data amplification unit may be further configured to: generate the even-number amplification data by amplifying data of the even-number data input, simultaneously to a sinking electric current path of the even-number amplification data output end shorting out in a section in which: the positive clock is activated, and the negative clock is inactivated, and latch the even-number amplification data, simultaneously to a sinking electric current path of the even-number amplification data output end being opened in a section in which: the positive clock is inactivated, and the negative clock is activated.

In the buffering circuit, the odd-number data amplification unit may be further configured to: generate the odd-number amplification data by amplifying data of the odd-number data input, simultaneously to a sinking electric current path of the odd-number amplification data output end shorting out in a section in which: the negative clock is activated, and the positive clock is inactivated, and latch the odd-number amplification data, simultaneously to a sinking electric current path of the odd-number amplification data output end being opened in a section in which: the negative clock is inactivated, and the positive clock is activated.

In the buffering circuit, the even-number data buffering unit may be further configured to: perform sampling of the even-number data in response to the even-number data corresponding to a rising edge of the positive clock and a falling edge of the negative clock, amplify the sampled even-number data in a section in which: the positive clock is activated, and the negative clock is inactivated, and latch the sampled even-number data in a section in which: the positive clock is inactivated, and the negative clock is activated.

In the buffering circuit, the odd-number data buffering unit may be further configured to: perform sampling of the odd-number data in response to the odd-number data corresponding to a falling edge of the positive clock and a rising edge of the negative clock, amplify the sampled odd-number data in a section in which: the positive clock is inactivated, and the negative clock is activated, and latch the sampled odd-number data in a section in which: the positive clock is activated, and the negative clock is inactivated.

In another general aspect, there is provided a semiconductor device, including: a data buffering unit configured to: receive input data including (N*M) number of bits, and buffer the input data into: even-number data in a serial form, the even-number data including {(N/2)*M} bits, corresponding to a positive clock, and odd-number data in a serial form, the odd-number data including {(N/2)*M} bits, corresponding to a negative clock, and a serial/parallel conversion unit configured to generate N output data in a parallel form as the even-number and odd-number data are received and converted into a parallel form by N bits, the even-number and odd-number data each including M bits in a serial form, respectively.

In the semiconductor device: N may represent an even-number from among integers greater than 0, and M may represent an integer greater than 0.

In the semiconductor device, the data buffering unit may include: an even-number data buffering unit configured to: output the even-number data by performing sampling and amplification on an even-number bit, sequentially, from among the input data in a serial form at every section in which the positive clock is activated, and latch the even-number data sampled in a previous activation section at every section in which the positive clock is inactivated, and an odd-number data buffering unit configured to: output the odd-number data by performing sampling and amplification on an odd number bit, sequentially, from among the input data in a serial form at every section in which the negative clock is activated, and latch the odd-number data sampled in a previous activation section at every section in which the negative clock is inactivated.

In the semiconductor device, the data buffering unit may further include a rail-to-rail signal input unit configured to receive the input data in a serial form without reducing a voltage level swing scope.

In the semiconductor device, the even-number data buffering unit may include: an even-number data sampling unit configured to control providing data of an even number bit from among the input data in a serial form applied from the rail-to-rail signal input unit to an even-number data input end, in response to the positive clock, an even-number data amplification unit configured to: generate even-number amplification data by amplifying data of the even-number data input end in a section in which the positive clock is activated, and latch the even-number amplification data in a section in which the positive clock is inactivated, and an even-number data output unit configured to determine a logic level of an even number corresponding to a voltage level of the even-number amplification data.

In the semiconductor device, the odd-number data buffering unit may include: an odd-number data sampling unit configured to control providing data of an odd-number bit from among the input data in a serial form applied from the rail-to rail signal input unit to an odd-number data input end, in response to the negative clock, an odd-number data amplification unit configured to: generate odd-number amplification data by amplifying data of the odd-number data input end in a section in which the negative clock is activated, and latch odd-number amplification data in a section in which the negative clock is inactivated, and an odd-number data output unit configured to determine a logic level of an odd number corresponding to a voltage level of the odd-number amplification data.

In the semiconductor device, the even-number data sampling unit may be further configured to: perform sampling of the even-number data in response to the even-number data corresponding to a rising edge of the positive clock and a falling edge of the negative clock, amplify the sampled even-number data in a section in which: the positive clock is activated, and the negative clock is inactivated, and latch the sampled even-number data in a section in which: the positive clock is inactivated, and the negative clock is activated.

In the semiconductor device, the odd-number data buffering unit may be further configured to: perform sampling of the odd-number data in response to the odd-number data corresponding to a falling edge of the positive clock and a rising edge of the negative clock, amplify the sampled odd-number data in a section in which: the positive clock is inactivated, and the negative clock is activated, and latch the sampled odd-number data in a section in which: the positive clock is activated, and the negative clock is inactivated.

In another general aspect, there is provided a method for buffering circuit of a semiconductor device, the method comprising: sampling, by an even-number data buffering unit, even-number data from input data; amplifying and outputting the even-number data in a section in which a positive clock is activated; latching the even-number data in a section in which the positive clock is inactivated; sampling, by an odd-number data buffering unit, odd-number data from the input data; amplifying and outputting the odd-number data in a section in which a negative clock is activated; and latching the odd-number data in a section in which the negative clock is inactivated.

The method may further comprise receiving, by a rail-to-rail signal input unit, the input data without reducing a voltage level swing scope.

The method may further comprise: controlling, by an even-number data sampling unit, providing the input data from the rail-to-rail signal input unit to an even-number data input end, in response to the positive clock; generating, by an even-number data amplification unit, even-number amplification data by amplifying data provided to the even-number data input end in a section in which the positive clock is activated; latching even-number amplification data in a section in which the positive clock is inactivated; and determining, by an even-number data output unit, a logic level of an even number corresponding to a voltage level of the even-number amplification data.

The method may further comprise: controlling, by an odd-number data sampling unit, providing the input data from the rail-to-rail signal input unit to an odd-number data input end, in response to the negative clock; generating, by an odd-number data amplification unit, odd-number amplification data by amplifying data provided to the odd-number data input end in a section in which the negative clock is activated; latching odd-number amplification data in a section in which the negative clock is inactivated; and determining, by an odd-number data output unit, a logic level of an odd number corresponding to a voltage level of the odd-number amplification data.

The method may further comprise: providing the input data input from the rail-to-rail data input unit to the even-number data input end, in response to: a change of the positive clock from an inactivated state to an activated state; and a change of the negative clock from an activated state to an inactivated state; and not providing the input data input from the rail-to-rail data input unit to the even-number data input end, in response to: a change of the positive clock from an activated state to an inactivated state; and a change of the negative clock from an inactivated state to an activated state.

The method may further comprise: providing the input data input from the rail-to-rail data input unit to the odd-number data input end, in response to: a change of the negative clock from an inactivated state to an activated state; and a change of the positive clock from an activated state to an inactivated state; and not providing the input data input from the rail-to-rail data input unit to the odd-number data input end, in response to: a change of the negative clock from an activated state to an inactivated state; and a change of the positive clock from an inactivated state to an activated state.

The method may further comprise: generating the even-number amplification data by amplifying data of the even-number data input, simultaneously to a sinking electric current path of the even-number amplification data output end shorting out in a section in which: the positive clock is activated; and the negative clock is inactivated; and latching the even-number amplification data, simultaneously to a sinking electric current path of the even-number amplification data output end being opened in a section in which: the positive clock is inactivated; and the negative clock is activated.

The method may further comprise: generating the odd-number amplification data by amplifying data of the odd-number data input, simultaneously to a sinking electric current path of the odd-number amplification data output end shorting out in a section in which: the negative clock is activated; and the positive clock is inactivated; and latching the odd-number amplification data, simultaneously to a sinking electric current path of the odd-number amplification data output end being opened in a section in which: the negative clock is inactivated; and the positive clock is activated.

The method may further comprise: performing sampling of the even-number data in response to the even-number data corresponding to a rising edge of the positive clock and a falling edge of the negative clock; amplifying the sampled even-number data in a section in which: the positive clock is activated; and the negative clock is inactivated; and latching the sampled even-number data in a section in which: the positive clock is inactivated; and the negative clock is activated.

The method may further comprise: performing sampling of the odd-number data in response to the odd-number data corresponding to a falling edge of the positive clock and a rising edge of the negative clock; amplifying the sampled odd-number data in a section in which: the positive clock is inactivated; and the negative clock is activated; and latching the sampled odd-number data in a section in which: the positive clock is activated; and the negative clock is inactivated.

In another general aspect, there is provided a method for a semiconductor device, the method comprising: receiving, by a data buffering unit, input data comprising (N*M) number of bits; buffering, by the data buffering unit, the input data into: even-number data in a serial form, the even-number data comprising $\{(N/2)*M\}$ bits, corresponding to a positive clock; and odd-number data in a serial form, the odd-number data comprising $\{(N/2)*M\}$ bits, corresponding to a negative clock; and generating, by a serial/parallel conversion unit, N output data in a parallel form as the even-number and odd-number data are received and converted into a parallel form by N bits, the even-number and odd-number data each comprising M bits in a serial form, respectively.

In the method: N may represent an even-number from among integers greater than 0; and M may represent an integer greater than 0.

The method may further comprise: outputting, by an even-number data buffering unit, the even-number data by performing sampling and amplification on an even-number bit, sequentially, from among the input data in a serial form at every section in which the positive clock is activated; latching the even-number data sampled in a previous activation section at every section in which the positive clock is inactivated; outputting, by an odd-number data buffering unit, the odd-number data by performing sampling and amplification on an odd-number bit, sequentially, from among the input data in a serial form at every section in which the negative clock is activated; and latching the odd-number data sampled in a previous activation section at every section in which the negative clock is inactivated.

Other features and aspects may be apparent from the following detailed description, the drawings, and the claims.

Figure 1:
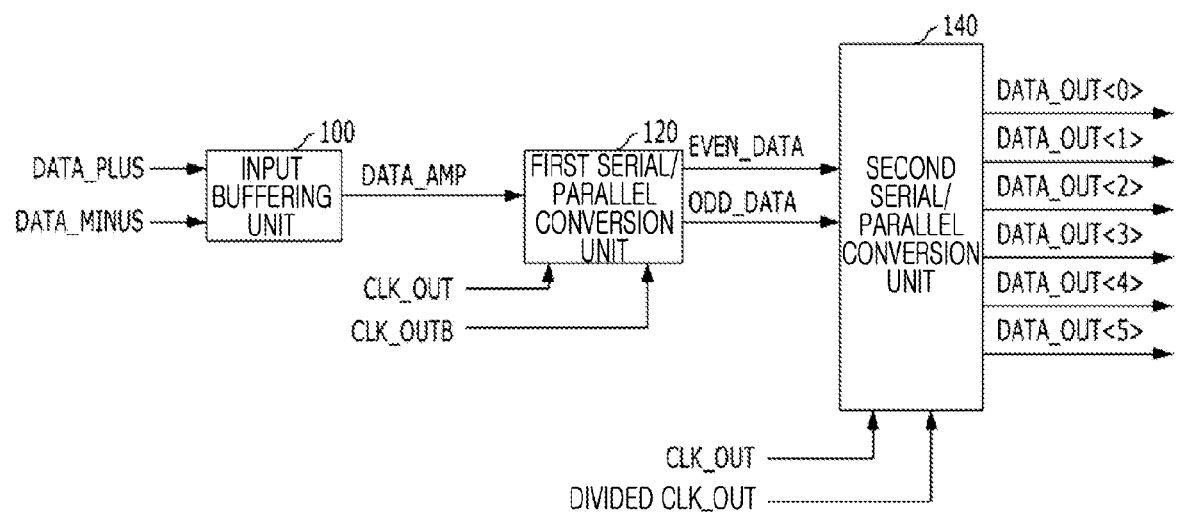
FIG. 1 is a block diagram to explain the operation of a conventional mLVDS receiver.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Aspects of the example embodiments relate to a buffering circuit which performs serial/parallel conversion operation to generate even-number data and odd-number data in the process of performing buffering operation.

Figure 2:
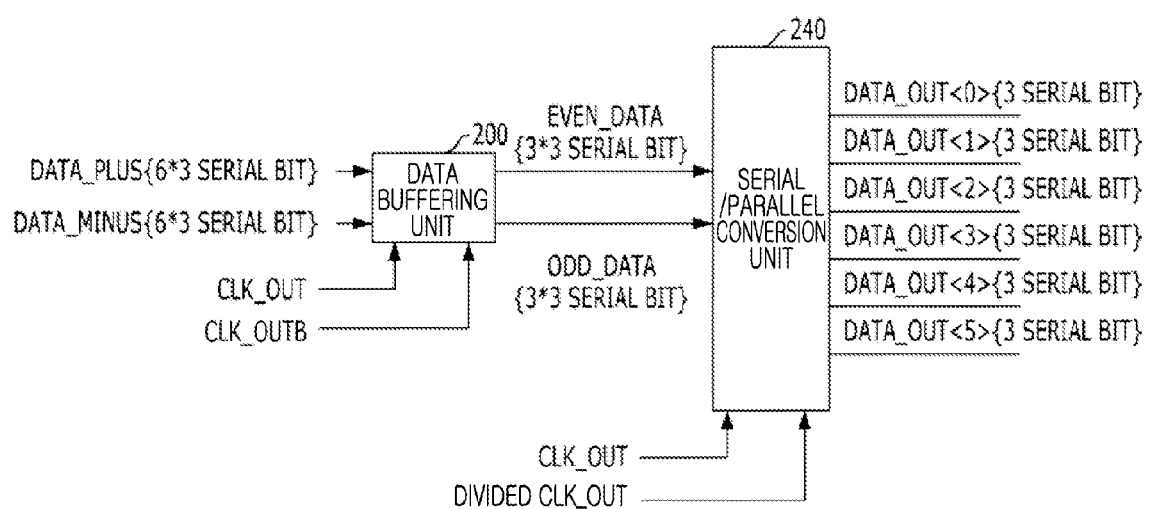
FIG. 2 is a block diagram to explain the operation of an mLVDS receiver according to an example embodiment.

FIG. 2 is a block diagram to explain the operation of a multipoint low-voltage differential signaling (mLVDS) receiver according to an example embodiment.

Referring to FIG. 2, the mLVDS receiver according to an example embodiment may include a data buffering unit 200 which may receive input data (DATA_PLUS{6*3 SERIAL BIT}, DATA_MINUS{6*3 SERIAL BIT}) including (N*M) number of bits in a serial form, and may buffer the received input data to even-number data (EVEN_DATA{3*3 SERIAL BIT}) including {(N/2)*M} bits corresponding to a positive clock (CLK_OUT) in a serial form, and odd-number data (ODD_DATA{3*3 SERIAL BIT}) including {(N/2)*M} bits corresponding to a negative clock (CLK_OUTB) in a serial form; and a serial/parallel conversion unit 240 which may receive even-number data (EVEN_DATA{3*3 SERIAL BIT}) and odd-number data (ODD_DATA{3*3 SERIAL BIT}), and may convert the received data to be in a parallel form by "N" bits to generate "N" number of output data (DATA_OUT<0>{3 SERIAL BIT}, DATA_OUT<1>{3 SERIAL BIT}, DATA_OUT<2>{3 SERIAL BIT}, DATA_OUT<3>{3 SERIAL BIT}, DATA_OUT<4>{3 SERIAL BIT}, DATA_OUT<5>{3 SERIAL BIT}) in a parallel form in which each data may include "M" bits in a serial form.

Meanwhile, "N" may represent an even number from among integers greater than "0", and "M" may represent an integer greater than "0". Accordingly, "N" may be "6" and "M" may be "3" as illustrated in FIG. 2, but other numbers may also be applied to "N" and "M".

Figure 3:
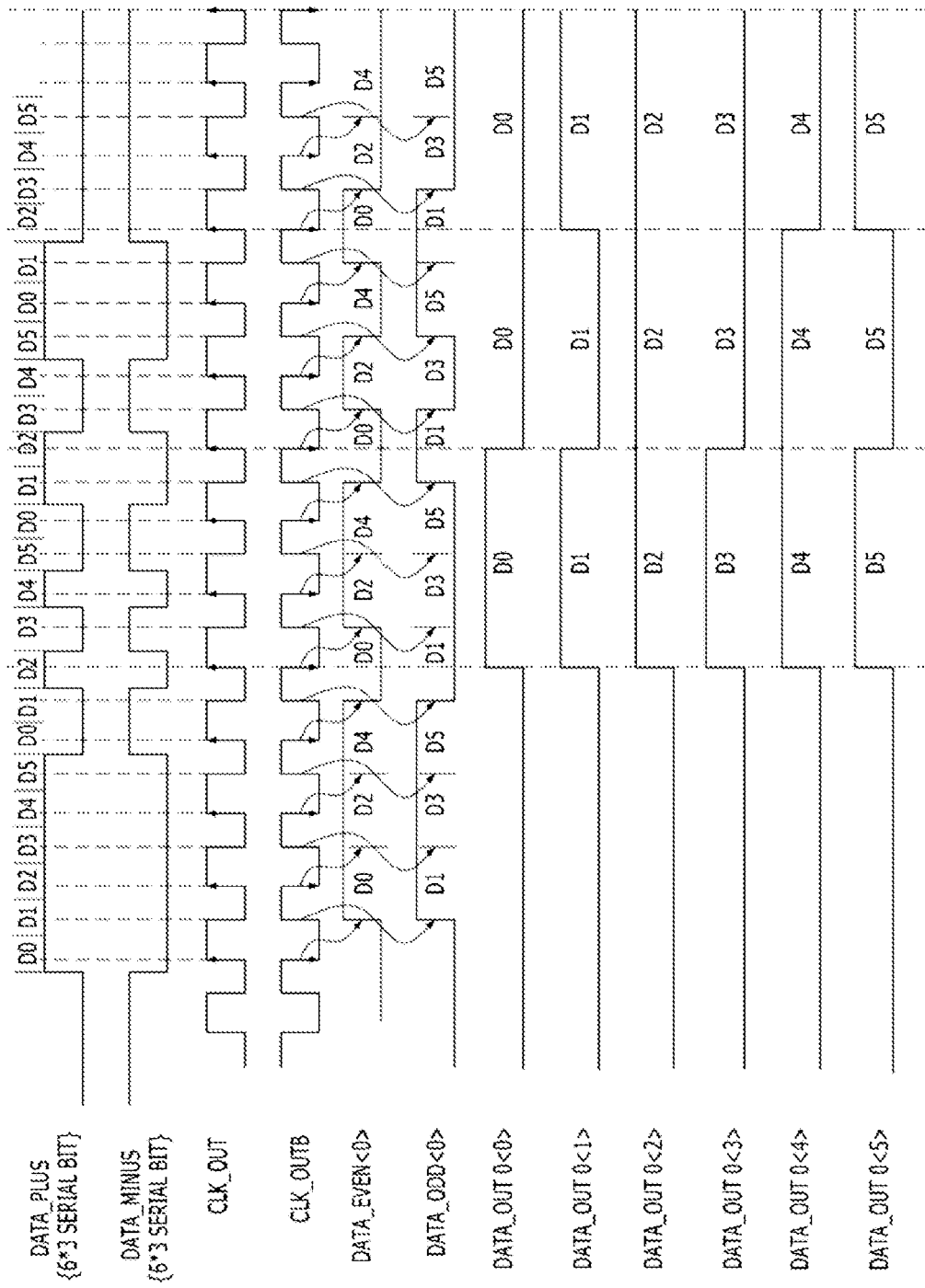
FIG. 3 is a timing diagram to explain that a plurality of data in a serial form is applied to an mLVDS receiver according to the example embodiment illustrated in FIG. 2.

FIG. 3 is a timing diagram to explain that a plurality of data in a serial form is applied to an mLVDS receiver according to the example embodiment illustrated in FIG. 2.

Referring to FIG. 3, the mLVDS receiver according to an example embodiment may perform sampling of (3*3) number of even-number data (EVEN_DATA{3*3 SERIAL BIT}) with reference to a positive clock (CLK_OUT), and may perform sampling of (3*3) number of odd-number data (ODD_DATA{3*3 SERIAL BIT}) with reference to a negative clock (CLK_OUTB), in response to input data (DATA_PLUS{6*3 SERIAL BIT}, DATA_MINUS{6*3 SERIAL BIT}), including (6*3) number of bits, being applied.

Accordingly, a data window section of even-number data (EVEN_DATA{3*3 SERIAL BIT}) and odd-number data (ODD_DATA{3*3 SERIAL BIT}) may become two times larger than that of input data (DATA_PLUS{6*3 SERIAL BIT}, DATA_MINUS{6*3 SERIAL BIT}).

In response to even-number data (EVEN_DATA{3*3 SERIAL BIT}) being applied again, $0^{th}$ output data (DATA_OUT<0>{3 SERIAL BIT}), second output data (DATA_OUT<2>{3 SERIAL BIT}), and the fourth output data (DATA_OUT<4>{3 SERIAL BIT}), with reference to a positive clock (CLK_OUT), may be sampled. Likewise, in response to odd-number data (ODD_DATA{3*3 SERIAL BIT}) being applied, first output data (DATA_OUT<1>{3 SERIAL BIT}), third output data (DATA_OUT<3>{3 SERIAL BIT}), and fifth output data (DATA_OUT<5>{3 SERIAL BIT}), with reference to a negative clock (CLK_OUTB), may be sampled.

Accordingly, a window section of output data (DATA_OUT<0>{3 SERIAL BIT}, DATA_OUT<1>{3 SERIAL BIT}, DATA_OUT<2>{3 SERIAL BIT}, DATA_OUT<3>{3 SERIAL BIT}, DATA_OUT<4>{3 SERIAL BIT}, DATA_OUT<5>{3 SERIAL BIT}) may be three times larger than the data window section of even-number data (EVEN_DATA{3*3 SERIAL BIT}) and odd-number data (ODD_DATA{3*3 SERIAL BIT}).

As such, the operation of the mLVDS receiver according to an example embodiment may be the same as the operation of the mLVDS receiver according to the FIG. 1 example. However, the mLVDS receiver according to an example embodiment may include the operation of sampling (3*3) number (e.g., M×M) of even-number data (EVEN_DATA{3*3 SERIAL BIT}) and (3*3) number of odd-number data (ODD_DATA{3*3 SERIAL BIT}) in the process of receiving and buffering (6*3) number (e.g., N×M) of input data (DATA_PLUS {6*3 SERIAL BIT}, DATA_MINUS{6*3 SERIAL BIT}).

Figure 4:
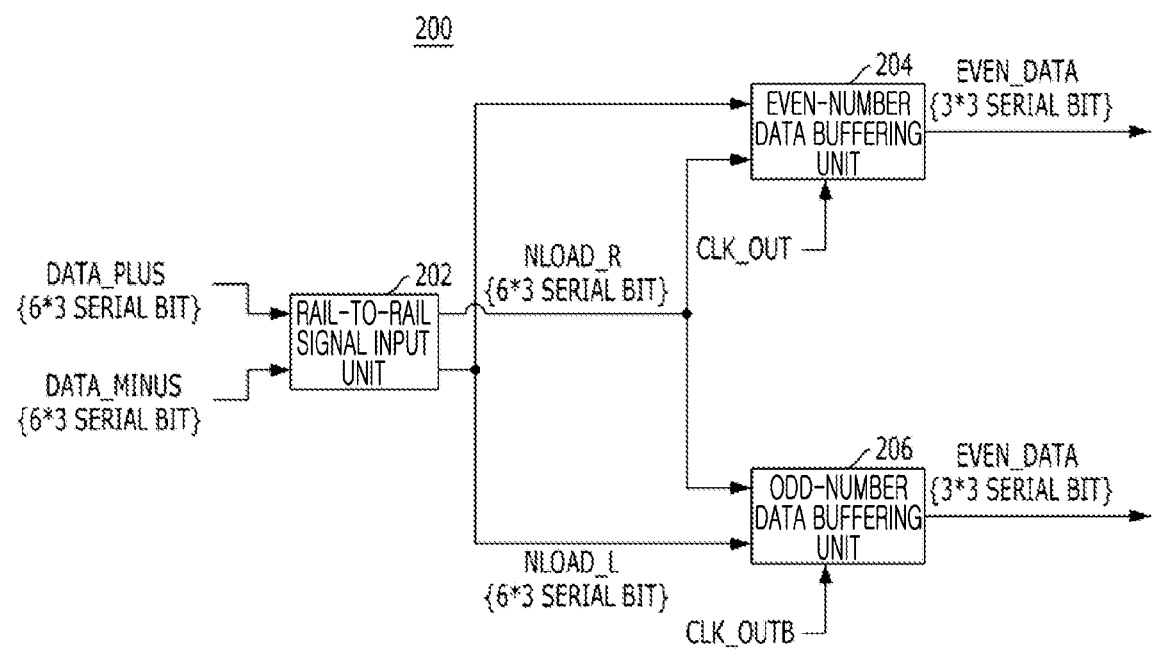
FIG. 4 is a block diagram illustrating a data buffering unit from among the components of an mLVDS receiver according to the example embodiment illustrated in FIG. 2.

FIG. 4 is a block diagram illustrating a data buffering unit from among the components of an mLVDS receiver according to the example embodiment illustrated in FIG. 2.

Referring to FIG. 4, the data buffering unit 200 from among the components of the mLVDS receiver according to an example embodiment may include a even-number data buffering unit 204 which may output even-number data (EVEN_DATA{3*3 SERIAL BIT}) by performing sampling and amplification on an even-number bit sequentially from among input data (DATA_PLUS {6*3 SERIAL BIT}, DATA_MINUS {6*3 SERIAL BIT}), which may be input in a serial form at every section in which a positive clock (CLK_OUT) is activated, and may latch the even-number data (EVEN_DATA{3*3 SERIAL BIT}) sampled in the previous activation section at every section in which the positive clock (CLK_OUT) is inactivated; and an odd-number data buffering unit 206 which may output even-number data (ODD_DATA{3*3 SERIAL BIT}) by performing sampling and amplification on an odd-number bit sequentially from among input data (DATA_PLUS {6*3 SERIAL BIT}, DATA_MINUS {6*3 SERIAL BIT }), which may be input in a serial form at every section in which a negative clock (CLK_OUTB) is activated, and may latch the odd-number data (ODD_DATA{3*3 SERIAL BIT}) sampled in the previous activation section at every section in which the negative clock (CLK_OUTB) is inactivated. In addition, the data buffering unit 200 may further include a rail-to-rail signal input unit 202 for receiving data (DATA_PLUS {6*3 SERIAL BIT}, DATA_MINUS {6*3 SERIAL BIT }), which may be applied in a serial form without reducing a voltage level swing range.

The data (DATA_PLUS {6*3 SERIAL BIT }, DATA_MINUS{6*3 SERIAL BIT}), which may be applied to the buffering unit 200 in a serial form, may be input as being divided into "DATA_PLUS{6*3 SERIAL BIT}" data and "DATA_MINUS{6*3 SERIAL BIT}" data, as a signal may be generally input in a differential form in an example of an mLVDS amplifier. Therefore, "DATA_PLUS {6*3 SERIAL BIT}" data and "DATA_MINUS {6*3 SERIAL BIT}" data may be signals which have the same data value therein, only with differences in their voltage level.

Meanwhile, as the even-number data (EVEN_DATA{3*3 SERIAL BIT}) and the odd-number data (ODD_DATA{3*3 SERIAL BIT}) output from the data buffering unit 200 may not be signals in a differential form, it may be possible to represent an input data value (DATA_PLUS{6*3 SERIAL BIT}, DATA_MINUS{6*3 SERIAL BIT}) through the values of the even-number data (EVEN_DATA{3*3 SERIAL BIT}) and the odd-number data (ODD_DATA{3*3 SERIAL BIT}).

Figure 5:
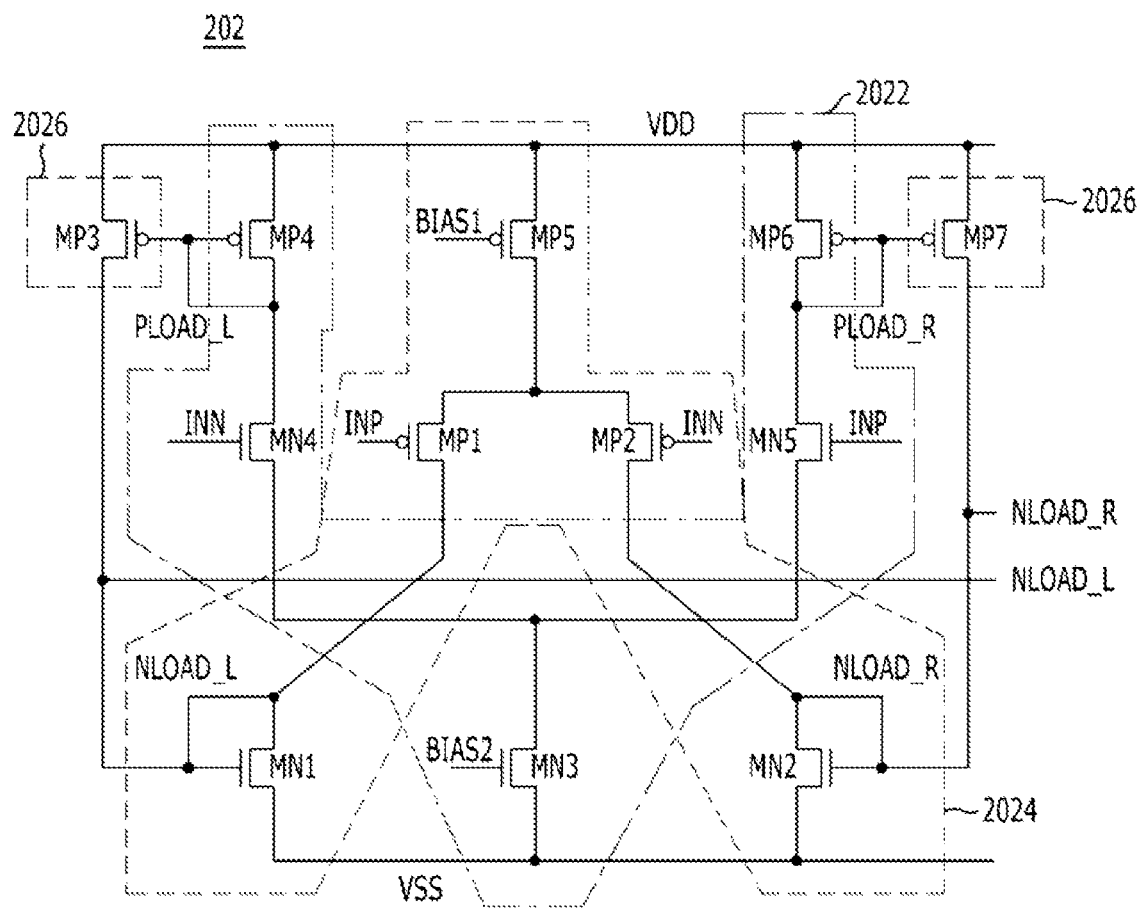
FIG. 5 is a detailed circuit diagram illustrating a rail-to-rail signal input unit from among the components of a data buffering unit according to the example embodiment illustrated in FIG. 4.

FIG. 5 is a detailed circuit diagram illustrating a rail-to-rail signal input unit from among the components of a data buffering unit according to the example embodiment illustrated in FIG. 4.

Referring to FIG. 5, the rail-to-rail signal input unit 202 from among the components of the data buffering unit 200 according to an example embodiment may include an PMOS-type input unit 2024 for receiving data without reducing a voltage level, in an example in which the voltage level of an input data (INN, INP) is lower than a particular voltage level; an NMOS-type input unit 2022 for receiving data without reducing a voltage level, in an example in which the voltage level of the input data (INN, INP) is higher than a particular voltage level; and an input connection unit 2026 for outputting the input data (INN, INP) as final input data (NLOAD_L, NLOAD_R) while the voltage level of the input data (INN, INP) is not reduced by connecting the PMOS-type input unit 2024 and the NMOS-type input unit 2022 in the form of an electric current minor. The NMOS-type input unit 2022 may include N-type (NMOS) transistors MN3, MN4, MN5, and P-type (PMOS) transistors MP4, MP6. The PMOS-type input unit 2024 may include N-type transistors MN1, MN2, and P-type transistors MP1, MP2, MPS. The input connection unit 2026 may include P-type transistors MP3, MP7. A positive (or power) voltage VDD and a negative (or ground) voltage VSS, may also be supplied.

Meanwhile, the voltage level of the data (PLOAD_L, PLOAD_R) output from the PMOS-type input unit 2024 may be amplified in comparison with the voltage level of the input data (INN, INP), and the voltage level of the final input data (NLOAD_L, NLOAD_R) output from the NMOS-type input unit 2022 through the input connection unit 2026 may be amplified in comparison with the voltage level of the data (PLOAD_L, PLOAD_R) output from the PMOS-type input unit 2024, as a differential amplification operation may occur during the input process. Nevertheless, the main operation of the rail-to-rail signal input unit 202 may be described as the input operation rather than the amplification operation because the voltage level amplified by the rail-to-rail signal input unit 202 may be minimal, taking the overall operation into consideration.

Figure 6:
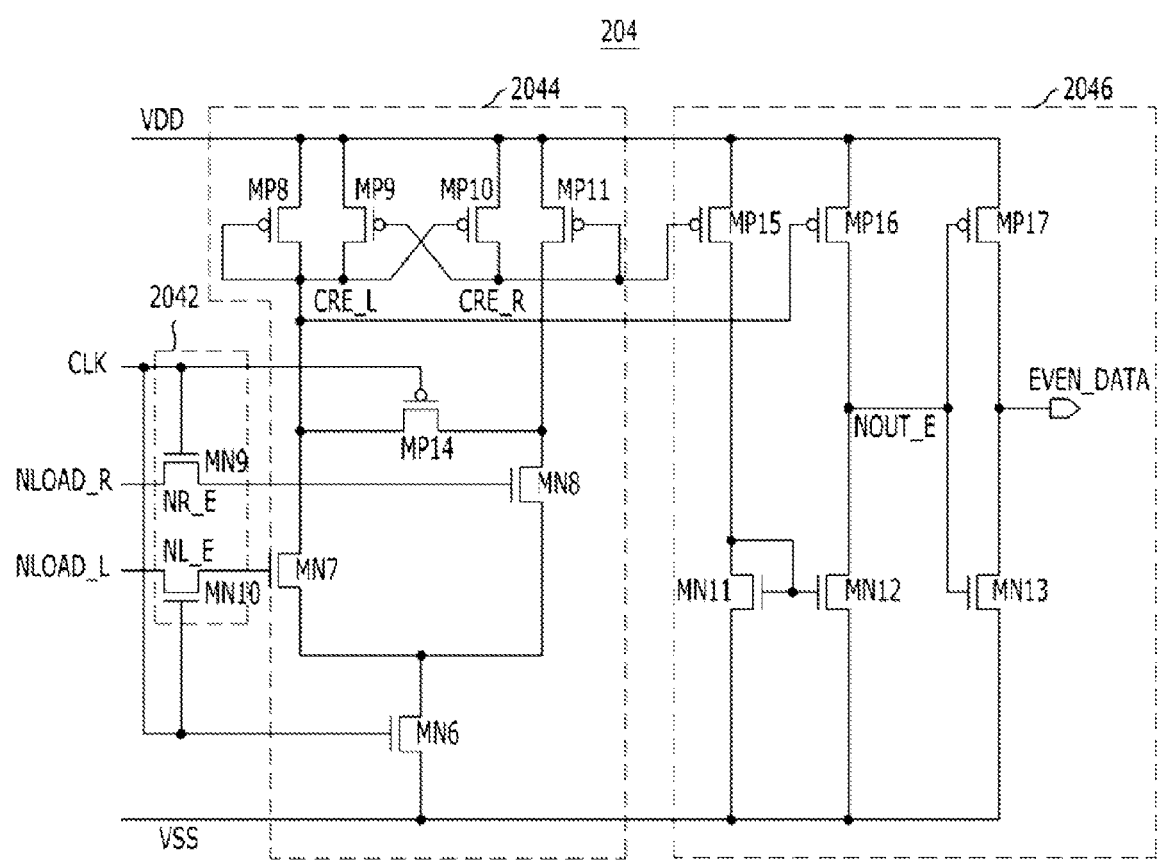
FIG. 6 is a detailed circuit diagram illustrating an even-number data buffering unit from among the components of a data buffering unit according to the example embodiment illustrated in FIG. 4.

FIG. 6 is a detailed circuit diagram illustrating an even-number data buffering unit from among the components of a data buffering unit according to the example embodiment illustrated in FIG. 4.

Referring to FIG. 6, the even-number data buffering unit 204 from among the components of the data buffering unit 200 according to an example embodiment may include an even-number data sampling unit 2042 which may control the providing of an even-number bit data from among the input data (NLOAD_L, NLOAD_R) in a serial form (6*3 SERIAL BIT) applied from the rail-to rail signal input unit 202, in response to the positive clock (CLK_OUT) to an even-number data input end (NR_E, NL_E); an even-number data amplification unit 2044 which may generate even-number amplification data (CRE_L, CRE_R) by amplifying the data of the even-number data input end (NR_E, NL_E) at every section in which the positive clock (CLK_OUT) is activated, and may latch even-number amplification data (CRE_L, CRE_R) at every section in which the positive clock (CLK_OUT) is inactivated; and an even-number data output unit 2046 which may determine the logic level of even-numbered data (EVEN_DATA), including the 3*3 SERIAL BIT, corresponding to the voltage level of even-number amplification data (CRE_L, CRE_R). The even-number data sampling unit 2042 may include N-type transistors MN9, MN10. The even-number data amplification unit 2044 may include N-type transistors MN6, MN7, MN8, and P-type transistors MP8, MP9, MP10, MP11, MP14. The even-number data output unit 2046 may include N-type transistors MN11, MN12, MN13, and P-type transistors MP15, MP16, MP17. A positive (or power) voltage VDD and a negative (or ground) voltage VSS, may also be supplied.

As described above, the even-number data buffering unit 204 according to an example embodiment may perform sampling of even-number data (CRE_L, CRE_R) whenever the even-number data corresponds to the rising edge of the positive clock (CLK_OUT) and the falling edge of the negative clock (CLK_OUTB). In addition, the sampled even-number data (CRE_L, CRE_R) may be amplified at every section in which the positive clock (CLK_OUT) is activated and at every section in which the negative clock (CLK_OUTB) is inactivated, and the sampled even-number data (CRE_L, CRE_R) may be latched at every section in which the positive clock (CLK_OUT) is inactivated and at every section in which the negative clock (CLK_OUTB) is activated.

That is, the even-number buffering unit 204 may repeat the operation of sampling even-number data (CRE_L, CRE_R) from among input data (NLOAD_L, NLOAD_R) input from the rail-to-rail data input unit 202, in response to the toggling operation of the positive clock (CLK_OUT), along with the operation of amplifying the sampled even-number data (CRE_L, CRE_R) and the operation of latching the amplified even-number data (CRE_L, CRE_R).

For example, the even-number sampling unit 2042 from among the components of the even-number data buffering 204 may provide input data (NLOAD_L, NLOAD_R) input from the rail-to-rail data input unit 202 to an even-number data input end (NR_E, NL_E), in response to the change of the state of the positive clock (CLK_OUT) from an inactivated state to an activated state, and the change of the state of the negative clock (CLK_OUTB) from an activated state to an inactivated state. However, the even-number sampling unit 2042 may not provide input data (NLOAD_L, NLOAD_R) input from the rail-to-rail data input unit 202 to an even-number data input end (NR_E, NL_E), in response to the change of the state of the positive clock (CLK_OUT) from an activated state to an inactivated state, and the change of the state of the negative clock (CLK_OUTB) from an inactivated state to an activated state.

In addition, the even-number data amplification unit 2044 from among the components of the even-number data buffering 204 may repeat the operation of amplifying and latching the sampled even-number data (CRE_L, CRE_R) as the data of the even-number data input end (NR_E, NL_E) is amplified, simultaneously to the sinking electric current path of the even-number data output end (CRE_L, CRE_R) shorting out in a section in which the positive clock (CLK_OUT) is activated, and the negative clock (CLK_OUTB) is inactivated, to generate even-number amplification data (CRE_L, CRE_R). In addition, even-number amplification data (CRE_L, CRE_R) may be latched, simultaneously to the sinking electric current path of an even-number amplification data end (CRE_L, CRE_R) being opened in a section in which the positive clock (CLK_OUT) is inactivated, and the negative clock (CLK_OUTB) is activated.

That is, the even-number data amplification unit 2044 may perform a normal differential amplification operation by letting electric current be released through the sinking electric current path of the even-number amplification data output end (CRE_L, CRE_R), while performing the operation of amplifying the sampled even-number data (CRE_L, CRE_R). In one example, the normal differential amplification operation may be performed as a state in which a positive even-number amplification data output end (CRE_L) and a negative even-number amplification data output end (CRE_R) are opened is maintained.

On the other hand, the voltage level of the even-number data (CRE_L, CRE_R) which may be amplified in the previous differential amplification operation may be maintained, as electric current may not be released through the sinking electric current path while the sampled and amplified even-number data (CRE_L, CRE_R) is latched. In one example, the positive even-number amplification data output end (CRE_L) and the negative even-number amplification data output end (CRE_R) may maintain a short-out state which may be different from each other. Thus, the latch operation may be performed normally.

In addition, the even-number data output unit 2046 from among the components of the even-number data buffering 204 may determine the logic level of even-number data (EVEN_DATA) in response to the positive even-number amplification data output end (CRE_L) and the negative even-number amplification data output end (CRE_R) having an opposite voltage level from each other, as the even-number data amplification unit 2044 amplifies the sampled even-number data (CRE_L, CRE_R). However, the even-number data (EVEN_DATA) may maintain the logic level which may be determined in the previous amplification section in response to the positive even-number amplification data output end (CRE_L) and the negative even-number amplification data output end (CRE_R) having the same voltage level, as the even-number data amplification unit 2044 latches the sampled and amplified even-number data (CRE_L, CRE_R).

Meanwhile, in response to the positive even-number amplification data output end (CRE_L) and the negative even-number amplification data output end (CRE_R) being opened with each other, thus having an opposite voltage level from each other, there may be a considerable difference in the amount of electric current in a source-drain end between MP15 and MP16, the PMOS transistors included in the even-number data output unit 2046. Therefore, the logic level of the even-number data (EVEN_DATA) may be determined as logic "high" or logic "low." However, in response to the positive even-number amplification data output end (CRE_L) and the negative even-number amplification data output end (CRE_R) being shorted out with each other, thus having the same voltage level, the amount of electric current in the source-drain end of the PMOS transistors MP15 and MP16 may become the same. Therefore, the logic level of the even-number data (EVEN_DATA) may not be changed. Thus, the logic level of the even-number data (EVEN_DATA), which may be determined in the previous amplification section, may be maintained as it is.

Of course, as the operation of compulsorily latching the logic level of the even-number data (EVEN_DATA) may not be included in the operation of latching the sampled and amplified even-number data (CRE_L, CRE_R) by the even-number data amplification unit 2044, if the operation is maintained for a prolonged period of time, electric current may not flow into the source-drain end of the PMOS transistors MP15 and MP16 included in the even-number data output unit 2046. Thus, the logic level of the even-number data (EVEN_DATA) may be changed. However, this may only occur in response to the frequency of the positive clock (CLK_OUT) being too slow. As the mLVDS receiver according to an example embodiment may use a high-speed clock, there may be little possibility that such a problem may occur.

Figure 7:
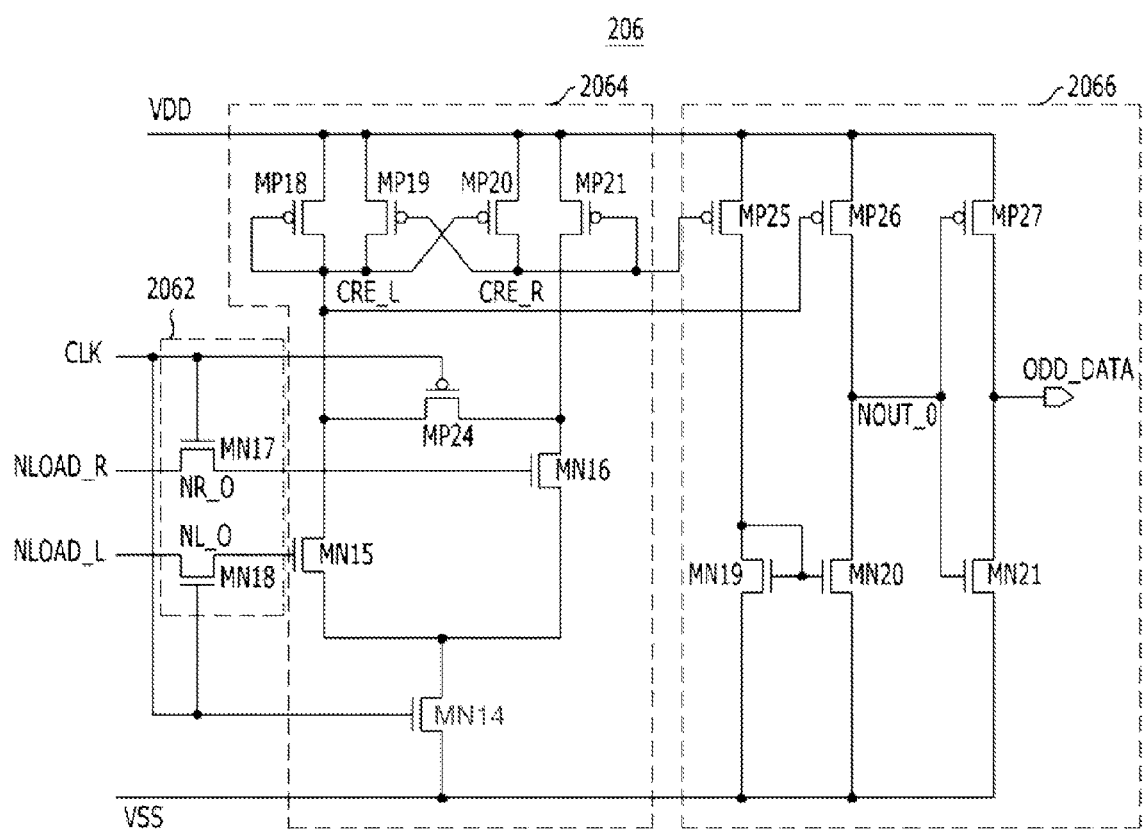
FIG. 7 is a detailed circuit diagram illustrating an odd-number data buffering unit from among the components of a data buffering unit according to the example embodiment illustrated in FIG. 4.

FIG. 7 is a detailed circuit diagram illustrating an odd-number data buffering unit from among the components of a data buffering unit according to the example embodiment illustrated in FIG. 4.

Referring to FIG. 7, the odd-number data buffering unit 206 from among the components of the data buffering unit 200 according to an example embodiment may include an odd-number data sampling unit 2062 which may control the providing of an odd-number bit data from among the input data (NLOAD_L, NLOAD_R) in a serial form (6*3 SERIAL BIT) applied from the rail-to rail signal input unit 202, in response to the negative clock (CLK_OUTB) to an odd-number data input end (NR_O, NL_O); an odd-number data amplification unit 2064 which may generate odd-number amplification data (CRO_L, CRO_R) by amplifying the data of the odd-number data input end (NR_O, NL_O) at every section in which the negative clock (CLK_OUTB) is activated, and may latch odd-number amplification data (CRO_L, CRO_R) at every section in which the negative clock (CLK_OUTB) is inactivated; and an odd-number data output unit 2066 which may determine the logic level of odd-number data (ODD_DATA), including the 3*3 SERIAL BIT, corresponding to the voltage level of odd-number amplification data (CRO_L, CRO_R). The odd-number data sampling unit 2062 may include N-type transistors MN17, MN18. The odd-number data amplification unit 2064 may include N-type transistors MN14, MN15, MN16, and P-type transistors MP18, MP19, MP20, MP21, MP24. The odd-number data output unit 2066 may include N-type transistors MN19, MN20, MN21, and P-type transistors MP25, MP26, MP27. A positive (or power) voltage VDD and a negative (or ground) voltage VSS, may also be supplied.

As described above, the odd-number data buffering unit 206 according to an example embodiment may perform sampling of odd-number data (CRO_L, CRO_R) whenever the odd-number data corresponds to the rising edge of the negative clock (CLK_OUTB) and the falling edge of the positive clock (CLK_OUT). In addition, the sampled odd-number data (CRO_L, CRO_R) may be amplified at every section in which the negative clock (CLK_OUTB) is activated and at every section in which the positive clock (CLK_OUT) is inactivated, and the sampled odd-number data (CRO_L, CRO_R) may be latched at every section in which the negative clock (CLK_OUTB) is inactivated and at every section in which the positive clock (CLK_OUT) is activated.

That is, the odd-number buffering unit 206 may repeat the operation of sampling odd-number data (CRO_L, CRO_R) from among input data (NLOAD_L, NLOAD_R) input from the rail-to-rail data input unit 202, in response to the toggling operation of the negative clock (CLK_OUTB) along with the operation of amplifying the sampled odd-number data (CRO_L, CRO_R) and the operation of latching the amplified odd-number data (CRO_L, CRO_R).

For example, the odd-number sampling unit 2062 from among the components of the odd-number data buffering 206 may provide input data (NLOAD_L, NLOAD_R) input from the rail-to-rail data input unit 202 to an odd-number data input end (NR_O, NL_O), in response to the change of the state of the negative clock (CLK_OUTB) from an inactivated state to an activated state, and the change of the state of the positive clock (CLK_OUT) from an activated state to an inactivated state. However, the odd-number sampling unit 2062 may not provide input data (NLOAD_L, NLOAD_R) input from the rail-to-rail data input unit 202 to an odd-number data input end (NR_O, NL_O), in response to the change of the state of the negative clock (CLK_OUTB) from an activated state to an inactivated state, and the change of the state of the positive clock (CLK_OUT) from an inactivated state to an activated state-.

In addition, the odd-number data amplification unit 2064 from among the components of the odd-number data buffering 206 may repeat the operation of amplifying and latching the sampled odd-number data (CRO_L, CRO_R) as the data of the odd-number data input end (NR_O, NL_O) is amplified, simultaneously to the sinking electric current path of the odd-number data output end (CRO_L, CRO_R) shorting out in a section in which the negative clock (CLK_OUTB) is activated and the positive clock (CLK_OUT) is inactivated, to generate odd-number amplification data (CRO_L, CRO_R). In addition, odd-number amplification data (CRO_L, CRO_R) is latched, simultaneously to the sinking electric current path of an odd-number amplification data end (CRO_L, CRO_R) being opened in a section in which the negative clock (CLK_OUTB) is inactivated and the positive clock (CLK_OUT) is activated.

That is, the odd-number data amplification unit 2064 may perform a normal differential amplification operation by letting electric current be released through the sinking electric current path of the odd-number amplification data output end (CRO_L, CRO_R) while performing the operation of amplifying the sampled odd-number data (CRO_L, CRO_R). In one example, the normal differential amplification operation may be performed as a state, in which a positive odd-number amplification data output end (CRO_L) and a negative odd-number amplification data output end (CRO_R) are opened, may be maintained.

On the other hand, the voltage level of the odd-number data (CRO_L, CRO_R), which may be amplified in the previous differential amplification operation, may be maintained as electric current is not released through the sinking electric current path while the sampled and amplified odd-number data (CRO_L, CRO_R) is latched. In one example, the positive odd-number amplification data output end (CRO_L) and the negative odd-number amplification data output end (CRO_R) may maintain a short-out state which may be different from each other. Thus, the latch operation may be performed normally.

In addition, the odd-number data output unit 2066 from among the components of the odd-number data buffering 206 may determine the logic level of odd-number data (ODD_DATA) in response to the positive odd-number amplification data output end (CRO_L) and the negative odd-number amplification data output end (CRO_R) having an opposite voltage level from each other as the odd-number data amplification unit 2064 amplifies sampled odd-number data (CRO_L, CRO_R). However, the odd-number data (ODD_DATA) may maintain the logic level which may be determined in the previous amplification section in response to the positive odd-number amplification data output end (CRO_L) and the negative odd-number amplification data output end (CRO_R) having the same voltage level as the odd-number data amplification unit 2064 latches the sampled and amplified odd-number data (CRO_L, CRO_R).

Meanwhile, in response to the positive odd-number amplification data output end (CRO_L) and the negative odd-number amplification data output end (CRO_R) being opened with each other, thus having an opposite voltage level from each other, there may be a considerable difference in the amount of electric current in a source-drain end between MP25 and MP26, the PMOS transistors included in the odd-number data output unit 2066. Therefore, the logic level of the odd-number data (ODD_DATA) may be determined as logic "high" or logic "low." However, in response to the positive odd-number amplification data output end (CRO_L) and the negative odd-number amplification data output end (CRO_R) shorting out with each other, thus having the same voltage level, the amount of electric current in the source-drain end of the PMOS transistors MP25 and MP26 may become the same. Therefore, the logic level of the odd-number data (ODD_DATA) may not be changed. Thus, the logic level of the odd-numbered data (ODD_DATA) which may be determined in the previous amplification section is maintained as it is.

As the operation of compulsorily latching the logic level of the odd-number data (ODD_DATA) may not be included in the operation of latching the sampled and amplified odd-number data (CRO_L, CRO_R) by the odd-number data amplification unit 2064, if the operation is maintained for a prolonged period of time, electric current may not flow into the source-drain end of the PMOS transistors MP25 and MP26, included in the odd-number data output unit 2066. Thus, the logic level of the odd-number data (ODD_DATA) may be changed. However, this may only occur in response to the frequency of the negative clock (CLK_OUTB) being too slow. As the mLVDS receiver according to an example embodiment uses a high-speed clock, there may be little possibility that the above problem may occur.

Figure 8:
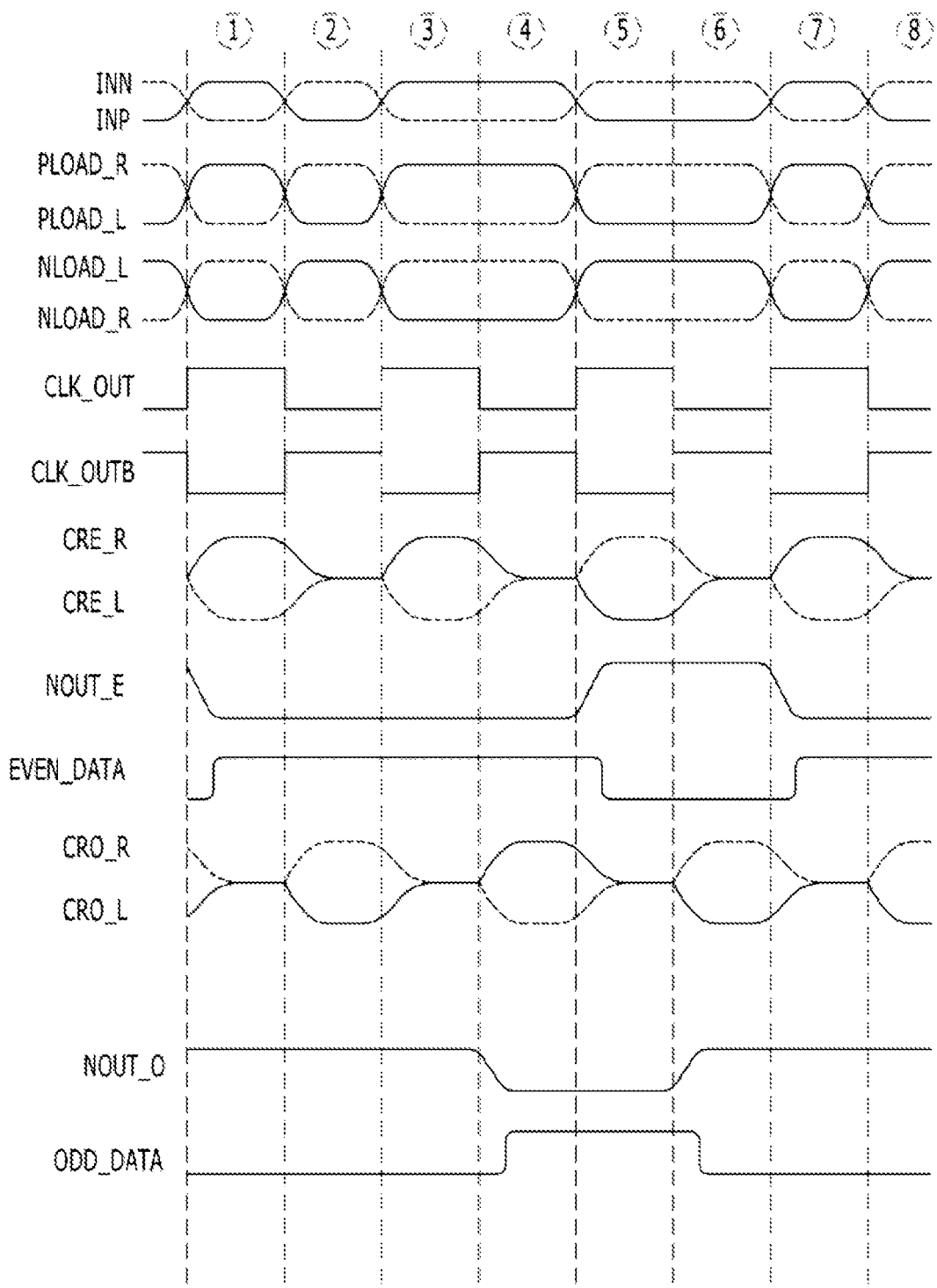
FIG. 8 is a timing diagram to explain the operation of a data buffering unit according to the example embodiment illustrated in FIG. 4.

FIG. 8 is a timing diagram to explain the operation of a data buffering unit according to the example embodiment illustrated in FIG. 4.

Referring to FIG. 8, from among the data (e.g., DATA_PLUS{8 SERIAL BIT}, DATA_MINUS{8 SERIAL BIT}) input to the data buffering unit 200 according to an example embodiment, "DATA_PLUS{8 SERIAL BIT}" may be "10110010" and "DATA_MINUS{8 SERIAL BIT}" may be "01001101".

In one example, the data (INN, INP) applied to the rail-to-rail signal input unit 202 from among the components of the data buffering unit 200 may become "10", "01", "10", "10", "01", "01", "10", "01" sequentially. Therefore, the data (PLOAD_L, PLOAD_R) output from the PMOS-type input unit 2024 may become "10", "01", "10", "10", "01", "01", "10", "01"; and the final input data (NLOAD_L, NLOAD_R) output from the NMOS-type input unit 2022 through the input connection unit 2026 may become "01", "10", "01", "01", "10", "10", "01", "10".

The final input data (NLOAD_L, NLOAD_R) may be input to the even-number data buffering unit 204 and the odd-number data buffering unit 206, respectively.

In an example of the operation of the even-number data buffering unit 204, the even-number data sampling unit 2042 may transmit the final input data (NLOAD_L, NLOAD_R) to the even-number data input end (NR_E, NL_E) only in a section in which the positive clock (CLK_OUT) is activated to logic "high." Thus, the even-number amplification data (CRE_L, CRE_R) may have a particular value only in a section in which the positive clock (CLK_OUT) is activated to logic "high."

Accordingly, although the final input data (NLOAD_L, NLOAD_R) may be "01", "10", "01", "01", "10", "10", "01", "10", the even-number data amplification unit 2044 may perform amplification operation in response to even-number data, e.g., the 0th data "01", the second data "01", the fourth data "10", and the sixth data "01", being input; and may perform latch operation in response to odd-number data, e.g., the first data "10, the third data "01", the fifth data "10", and the seventh data "10", being input, regardless of an input value. Accordingly, the even-number amplification data (CRE_L, CRE_R) ultimately output from the even-number data amplification unit 2044 may become: "10", a latch section, "10", a latch section, "01", a latch section, "10", and a latch section.

As such, the even-number data output unit 2046 may determine the logic level of even-number data (EVEN_DATA) as the value of the even-number amplification data (CRE_L, CRE_R) is determined. Thus, the value of the even-number data (EVEN_DATA) may change in a section in which the value of the even-number amplification data (CRE_L, CRE_R) is amplified. However, in a section in which the value of the even-number amplification data (CRE_L, CRE_R) is latched, the value determined in the previous amplification section may be maintained as it is.

Accordingly, the even-number data (EVEN_DATA) output from the even-number data output unit 2046 may be changed to logic "high" in the first amplification section in which the positive clock (CLK_OUT) is activated, under a presumption that the initial level of the even-number data (EVEN_DATA) is logic "low," and may maintain the value of the logic level "high" in the first latch section in which the positive clock (CLK_OUT) is inactivated. In addition, the even-number data (EVEN_DATA) output from the even-number data output unit 2046 may maintain the logic level of "high" in the second amplification section in which the positive clock (CLK_OUT) is activated, and may also maintain the logic level of "high" in the second latch section in which the positive clock (CLK_OUT) is inactivated. The even-number data (EVEN_DATA) output from the even-number data output unit 2046 may be changed to logic "low" in the third amplification section in which the positive clock (CLK_OUT) is activated, and may maintain the logic level of "low" in the third latch section in which the positive clock (CLK_OUT) is inactivated. In addition, the even-number data (EVEN_DATA) output from the even-number data output unit 2046 may be changed to logic "high" in the fourth amplification section in which the positive clock (CLK_OUT) is activated, and may maintain the logic level of "high" in the fourth latch section in which the positive clock (CLK_OUT) is inactivated.

In an example of the operation of the odd-number data buffering unit 206, the odd-number data sampling unit 2062 may transmit the final input data (NLOAD_L, NLOAD_R) to the odd-number data input end (NR_O, NL_O) only in a section in which the negative clock (CLK_OUTB) is activated to logic "high." Thus, the odd-number amplification data (CRO_L, CRO_R) may have a particular value only in a section in which the negative clock (CLK_OUTB) is activated to logic "high".

Accordingly, although the final input data (NLOAD_L, NLOAD_R) may be "01", "10", "01", "01", "10", "10", "01", "10", the odd-number data amplification unit 2064 may perform amplification operation in response to odd-number data, e.g., the first data "10", the third data "01"fifth data "10", and the seventh data "10", being input; and may perform latch operation in response to even-number data, e.g., the 0th data "01", the second data "01", the fourth data "10", and the sixth data "01", being input, regardless of an input value. Accordingly, the odd-number amplification data (CRO_L, CRO_R) ultimately output from the odd-number data amplification unit 2064 may become: a latch section, "10", a latch section, "01", a latch section, "10", a latch section, and "10".

As such, the odd-number data output unit 2066 may determine the logic level of odd-number data (EVEN_DATA) as the value of the odd-number amplification data (CRO_L, CRO_R) is determined. Thus, the value of the odd-number data (ODD_DATA) may change in a section in which the value of the odd-number amplification data (CRO_L, CRO_R) is amplified. However, in a section in which the value of the odd-number amplification data (CRO_L, CRO_R) is latched, the value determined in the previous amplification section may be maintained as it is.

Accordingly, the odd-number data (ODD_DATA) output from the odd-number data output unit 2066 may be changed to logic "low" in the first amplification section in which the negative clock (CLK_OUTB) is activated, under a presumption that the initial level of the odd-number data (ODD_DATA) is logic "low," and may maintain the value of the logic level "low" in the first latch section in which the negative clock (CLK_OUTB) is inactivated. In addition, the odd-number data (ODD_DATA) output from the even-number data output unit 2066 may maintain the logic level of "high" in the second amplification section in which the negative clock (CLK_OUTB) is activated, and may also maintain the logic level of "high" in the second latch section in which the negative clock (CLK_OUTB) is inactivated. The odd-number data (ODD_DATA) output from the odd-number data output unit 2066 may be changed to logic "low" in the third amplification section in which the negative clock (CLK_OUTB) is activated, and may maintain the logic level of "low" in the third latch section in which the negative clock (CLK_OUTB) is inactivated. In addition, the odd-number data (ODD_DATA) output from the odd-number data output unit 2066 may become the logic "high" in the fourth amplification section in which the negative clock (CLK_OUTB) is activated without a change in the logic level, and may maintain the logic level of "low" in the fourth latch section in which the negative clock (CLK_OUTB) is inactivated.

According to the above example embodiment, as a logic level is determined in the process of receiving and buffering a mLVDS signal and a data sampling circuit for distinguishing even-number data from odd-number data may be included in a buffering circuit which may amplify a voltage level, the buffering circuit may perform a buffering operation and serial/parallel conversion operation for generating even-number data and odd-number data simultaneously.

Accordingly, the process of converting serial data including a plurality of bits may be simplified. In addition, power consumption and a layout space may be reduced.

In the above example embodiment, the even-number data buffering unit 204 may operate corresponding to the positive clock (CLK_OUT), and the odd-number data buffering unit may 206 operate corresponding to the negative clock (CLK_OUTB), but this is only an example.

In addition, the location and type of the logic gate and the transistor in the above example embodiment may be embodied differently, depending on the polarity of an input signal.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. For example, the P-type and N-type transistors may be exchanged, as appropriate. Accordingly, other implementations are within the scope of the following claims.

What is claimed is:

1. A semiconductor device, comprising:
a data buffering unit configured to:
receive input data comprising (N*M) number of bits, wherein:
N represents an even-number from among integers greater than 0, and
M represents an integer greater than 0; and
buffer the input data into:
even-number data in a serial form, the even-number data comprising {(N/2)*M} bits, corresponding to a positive clock; and
odd-number data in a serial form, the odd-number data comprising {(N/2)*M} bits, corresponding to a negative clock; and
a serial/parallel conversion unit configured to generate N output data in a parallel form as the even-number and odd-number data are received and converted into a parallel form by N bits, the even-number and odd-number data each comprising M bits in a serial form, respectively.

2. The semiconductor device of claim 1, wherein the data buffering unit comprises:
an even-number data buffering unit configured to:
output the even-number data by performing sampling and amplification on an even-number bit, sequentially, from among the input data in a serial form at every section in which the positive clock is activated; and
latch the even-number data sampled in a previous activation section at every section in which the positive clock is inactivated; and
an odd-number data buffering unit configured to:
output the odd-number data by performing sampling and amplification on an odd-number bit, sequentially, from among the input data in a serial form at every section in which the negative clock is activated; and
latch the odd-number data sampled in a previous activation section at every section in which the negative clock is inactivated.

3. The semiconductor device of claim 2, wherein the data buffering unit further comprises a rail-to-rail signal input unit configured to receive the input data in a serial form without reducing a voltage level swing scope.

4. The semiconductor device of claim 3, wherein the even-number data buffering unit comprises:
an even-number data sampling unit configured to control providing data of an even-number bit from among the input data in a serial form applied from the rail-to-rail signal input unit to an even-number data input end, in response to the positive clock;
an even-number data amplification unit configured to:
generate even-number amplification data by amplifying data of the even-number data input end in a section in which the positive clock is activated; and
latch the even-number amplification data in a section in which the positive clock is inactivated; and
an even-number data output unit configured to determine a logic level of an even number corresponding to a voltage level of the even-number amplification data.

5. The semiconductor device of claim 4, wherein the odd-number data buffering unit comprises:
an odd-number data sampling unit configured to control providing data of an odd-number bit from among the input data in a serial form applied from the rail-to rail signal input unit to an odd-number data input end, in response to the negative clock;
an odd-number data amplification unit configured to:
generate odd-number amplification data by amplifying data of the odd-number data input end in a section in which the negative clock is activated; and
latch odd-number amplification data in a section in which the negative clock is inactivated; and
an odd-number data output unit configured to determine a logic level of an odd number corresponding to a voltage level of the odd-number amplification data.

6. The semiconductor device of claim 2, wherein the even-number data sampling unit is further configured to:
perform sampling of the even-number data in response to the even-number data corresponding to a rising edge of the positive clock and a falling edge of the negative clock;
amplify the sampled even-number data in a section in which:
the positive clock is activated; and
the negative clock is inactivated; and
latch the sampled even-number data in a section in which:
the positive clock is inactivated; and
the negative clock is activated.

7. The semiconductor device of claim 6, wherein the odd-number data buffering unit is further configured to:
perform sampling of the odd-number data in response to the odd-number data corresponding to a falling edge of the positive clock and a rising edge of the negative clock;
amplify the sampled odd-number data in a section in which:
the positive clock is inactivated; and
the negative clock is activated; and
latch the sampled odd-number data in a section in which:
the positive clock is activated; and
the negative clock is inactivated.

8. A method for a semiconductor device, the method comprising:
receiving, by a data buffering unit, input data comprising (N*M) number of bits, wherein:
N represents an even-number from among integers greater than 0, and
M represents an integer greater than 0;
buffering, by the data buffering unit, the input data into:

even-number data in a serial form, the even-number data comprising {(N/2)*M} bits, corresponding to a positive clock; and odd-number data in a serial form, the odd-number data comprising {(N/2)*M} bits, corresponding to a negative clock; and generating, by a serial/parallel conversion unit, N output data in a parallel form as the even-number and odd-number data are received and converted into a parallel form by N bits, the even-number and odd-number data each comprising M bits in a serial form, respectively.

9. The method of claim 8, further comprising:

outputting, by an even-number data buffering unit, the even-number data by performing sampling and amplification on an even-number bit, sequentially, from among the input data in a serial form at every section in which the positive clock is activated;

latching the even-number data sampled in a previous activation section at every section in which the positive clock is inactivated;

outputting, by an odd-number data buffering unit, the odd-number data by performing sampling and amplification on an odd-number bit, sequentially, from among the input data in a serial form at every section in which the negative clock is activated; and latching the odd-number data sampled in a previous activation section at every section in which the negative clock is inactivated.

* * * * *